(12) United States Patent
Hoang et al.

(10) Patent No.: US 7,098,542 B1
(45) Date of Patent: Aug. 29, 2006

(54) MULTI-CHIP CONFIGURATION TO CONNECT FLIP-CHIPS TO FLIP-CHIPS

(75) Inventors: Lan H. Hoang, Fremont, CA (US); Paul Ying-Fung Wu, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 143 days.

(21) Appl. No.: 10/703,327

(22) Filed: Nov. 7, 2003

(51) Int. Cl.
*H01L 23/48* (2006.01)
*H01L 23/02* (2006.01)

(52) U.S. Cl. ...................... 257/778; 257/686
(58) Field of Classification Search ................ 257/723, 257/686, 778, 773, 776
See application file for complete search history.

(56) References Cited

U.S. PATENT DOCUMENTS

| 5,399,898 A | * | 3/1995 | Rostoker | ..................... 257/499 |
| 6,150,724 A | | 11/2000 | Wenzel et al. | |
| 6,489,678 B1 | | 12/2002 | Joshi | |
| 6,731,009 B1 | * | 5/2004 | Jones et al. | .................. 257/777 |

FOREIGN PATENT DOCUMENTS

EP  0 559 366 A1  9/1993

OTHER PUBLICATIONS

XILINX, INC., "The Programmable Logic Databook 1998," pp 4-9 to 4-36 available from Xilinx, Inc., 2100 Logic Drive, San Jose, California, 95124.

* cited by examiner

*Primary Examiner*—Zandra V. Smith
*Assistant Examiner*—Kiesha Rose
(74) *Attorney, Agent, or Firm*—William L Paradise, III; Justin Liu

(57) ABSTRACT

A semiconductor structure includes a carrier having a cavity formed in a top portion thereof, and a plurality of conductive contacts formed on a top surface of the carrier and positioned around the periphery of the cavity. A number of first coplanar dice are back-side mounted to a top surface of the cavity, and a number of second coplanar dice are flip-chip mounted to the first dice, wherein each of the first dice is electrically connected to two corresponding adjacent second dice to connect the dice in a cascade configuration. For some embodiments, selected dice are flip-chip mounted to the carrier. For other embodiments, selected dice are wire-bond connected to the carrier.

30 Claims, 6 Drawing Sheets

MULTI-CHIP CONFIGURATION TO CONNECT FLIP-CHIPS TO FLIP-CHIPS

FIELD OF INVENTION

The present invention relates generally to semiconductor devices, and more specifically to semiconductor packages containing multiple integrated circuits.

DESCRIPTION OF RELATED ART

Typically, a plurality of integrated circuits (ICs) is formed on a semiconductor (e.g., silicon) wafer, which is then cut or "diced" to separate individual ICs from one another. The resulting bare IC dice (e.g., chips) are then packaged to protect them from external conditions. An IC package typically includes an IC die mounted on a substrate and encapsulated with a protective material. Conductive pads formed on the die are electrically connected to corresponding contacts formed on a first surface of the substrate. External leads formed on a second surface of the substrate and electrically connected to the pads on the first surface via the substrate's interconnect circuitry provide electrical connections to external systems (e.g., to other packaged dice).

A variety of die packaging techniques exists. For example, in one technique commonly known as Chip-On-Board (COB) packaging, the back-side surface of a bare IC die is directly mounted on the surface of a Printed Circuit Board (PCB), and bond pads on the active surface (e.g., the front-side surface) of the bare die are wire-bonded to corresponding pads on the surface of the PCB. In another technique commonly known as flip-chip packaging, conductive pads on the front-side surface of a bare IC die are bonded directly to corresponding pads formed on the surface of a substrate via conductive bumps. By replacing the wire bonds with conductive bumps, flip-chip technology not only reduces signal propagation delays between the die and the substrate but also saves area because the space previously required for wire bond connections can be made available for other purposes, for example, to accommodate larger dice.

More recently, IC packages that include multiple bare dice have been developed to further increase IC device integration and to reduce signal path lengths between IC dice. Sometimes referred to as Multi-Chip Modules (MCMs), these IC packages can include a plurality of bare dice connected to a package substrate or carrier via wire bonding, flip-chip connections, or a combination of the two. In some MCM packaging techniques, a plurality of bare IC dice are mounted in a coplanar arrangement on a package substrate that includes interconnect circuitry configured to route signals between the various dice. Although such multi-chip packages allow multiple dice to be enclosed in a single package, propagation delays of signals transmitted between the dice via the substrate's interconnect circuitry can reduce performance of the package. For example, when routing electrical signals between dice mounted on opposite ends of the package substrate, long signal paths extending across the package substrate are required. In addition, these long signal lines are susceptible to noise that can further degrade performance.

To reduce the signal line length of the package substrate's interconnect circuitry, other MCM packaging techniques stack multiple IC dice on top of one another in a vertical arrangement. However, many prior stacking techniques do not provide direct connections between the stacked dice, but rather rely upon the carrier's interconnect circuitry to provide such connections. Further, because the dice are stacked on top of one another, the amount of power being dissipated within the same area (e.g., the area of one chip) significantly increases, and can cause undesirable and potentially damaging local heating or "hot spots" on the dice.

Therefore, there is a need in the art for a multi-chip package that reduces propagation delays of signals transmitted between the various dice, occupies a minimal amount of substrate surface area, and exhibits superior heat dissipation.

SUMMARY

A multi-chip package is disclosed that includes a carrier configured to house overlying layers of staggered IC dice that can be flip-chip mounted to each other in a cascade configuration to minimize signal propagation delays between the dice. For some embodiments, the dice in one layer of the package can also be flip-chip mounted to corresponding pads on the carrier. By staggering the dice in one layer with respect to the dice in another layer so that the dice are not stacked directly on top of one another, heat dissipation can be improved over prior vertical stacking techniques. Further, because present embodiments include multiple layers of dice, device integration is greater than prior packages that have only one layer of dice.

For some embodiments, the carrier includes a cavity adapted to house a first layer of IC dice. The first layer of dice are back-side mounted to the cavity surface and have active surfaces that are substantially flush with the top of the cavity wall. A second layer of IC dice are flip-chip mounted to the first dice such that each die in the first layer is electrically connected to two adjacent dice in the second layer. For some embodiments, the die at each end of the second layer can also be flip-chip connected to corresponding first subsets of contact pads formed on the carrier. For one embodiment, each die in the second layer extends beyond the cavity and can be flip-chip connected to corresponding second subsets of contacts formed on the substrate. For other embodiments, the dice can be electrically connected to corresponding pads on the carrier via wire bond connections.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is applicable to a variety of integrated circuits and systems. In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Accordingly, the present invention is not to be construed as limited to specific examples described herein but rather includes within its scope all embodiments defined by the appended claims.

Figure 1A:
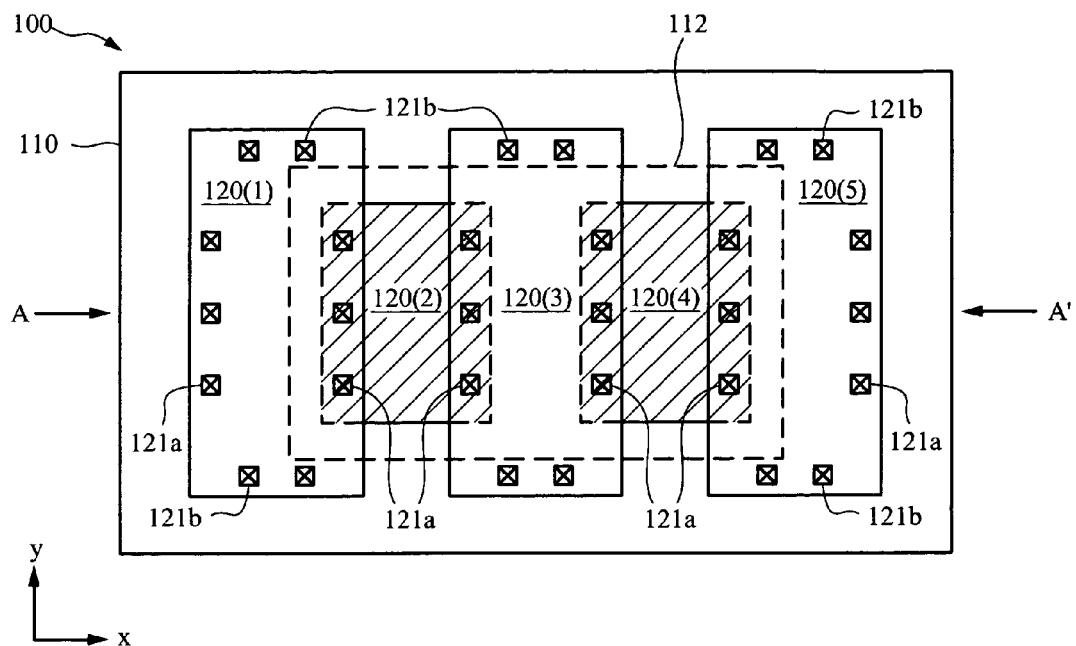
FIG. 1A is a top plan view of a multi-chip package in accordance with one embodiment of the present invention.
Figure 1B:
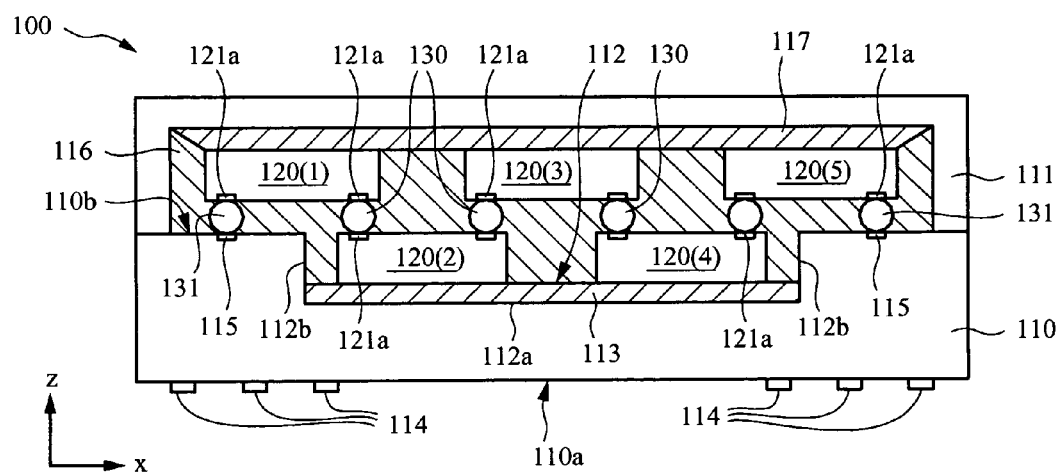
FIG. 1B is a cross-sectional view of the multi-chip package of FIG. 1A along line AA'.
Figure 1C:
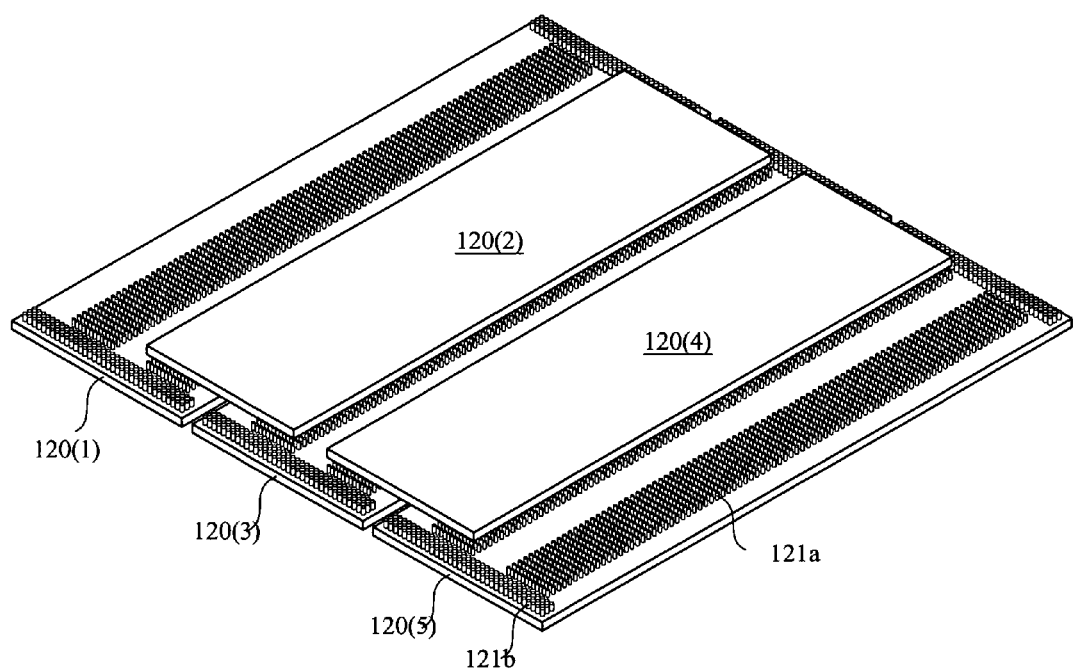
FIG. 1C is a partially exploded isometric view of a portion of the multi-chip package of FIG. 1A.

FIGS. 1A–1C show a multi-chip package 100 in accordance with one embodiment of the present invention. (Note that portions of multi-chip package 100 shown in FIG. 1C are shown upside down for clarity.) Package 100 includes a substrate or carrier 110 and a lid 111 adapted to house any number of bare (e.g., un-packaged) IC dice 120. For the exemplary embodiment illustrated in FIGS. 1A–1C, package 100 is configured to house five IC dice 120(1)–120(5), although other embodiments of package 100 can include other numbers of dice 120. IC dice 120(1)–120(5), each of which includes an active surface having any number of conductive pads 121 formed thereon, can be any suitable IC die fabricated using any well-known semiconductor processing technology. The conductive pads 121 provide I/O signal connections, ground and voltage supply connections, and/or other electrical connections for dice 120(1)–120(5). For simplicity, dice 120 are shown in FIGS. 1A and 1B as having only a few pads 121. However, in actual embodiments, each die 120 can have hundreds or even thousands of pads 121 (e.g., as illustrated by the exemplary embodiment of FIG. 1C). Conductive pads 121, which are sometimes referred to as flip-chip pads, can be formed as part of a well-known bumping process such as screen printing or selective plating.

For some embodiments, dice 120(1)–120(5) can be the same type of IC device that performs the same function. For other embodiments, dice 120(1)–120(5) can be different IC devices that perform different functions. For one embodiment, each die 120(1)–120(5) can be a programmable logic device (PLD) such as a Field Programmable Gate Array (FPGA) or a Complex PLD (CPLD), as described in more detail below with respect to FIG. 4. For another embodiment, each die 120(1)–120(5) can implement a selected portion of a PLD, as described in more detail below with respect to FIG. 5.

Carrier 110 and lid 111 are made of a suitable non-conductive material that effectively dissipates heat generated by dice 120. For some embodiments, carrier 110 and/or lid 111 are ceramic. For other embodiments, carrier 110 and/or lid 111 are an aluminum silicon carbide (AlSiC) composite. For still other embodiments, carrier 110 and lid 111 can be an organic material.

A cavity 112 is formed in a top portion of carrier 110 using well-known techniques such as, for example, etching. A first layer of dice 120(2) and 120(4) are back-side mounted to a top surface 112*a* of cavity 112 using a die attach material 113 so that the active surfaces and conductive pads 121 of dice 120(2) and 120(4) are facing up (e.g., along the z-axis). The first dice 120(2) and 120(4) are positioned in a coplanar arrangement such that the gap between adjacent dice 120(2) and 120(4) is substantially equal to the gaps between the dice 120 and cavity wall 112*b*. Die attach material 113, which can be any suitable material such as epoxy, soft or hard solder connections, or other suitable adhesive, also facilitates heat dissipation from dice 120 to the external environment. For some embodiments, the height of cavity wall 112*b* is equal to the combined height of dice 120(2)/120(4) and die attach material 113 so that the active surfaces of dice 120(2) and 120(4) are flush with the top of cavity wall 112*b*.

A plurality of external conductive balls 114 are formed on a bottom surface 110*a* of carrier 110 to provide electrical connections between package 100 and other IC circuits, devices, or systems (not shown for simplicity) external to package 100. For other embodiments, conductive balls 114 can be conductive leads, pins, bumps, or other external contacts. A plurality of conductive contacts or pads 115 formed on a top surface 110*b* of carrier 110 around the periphery of cavity 112 in a well-known manner are electrically connected to the plurality of external balls 114 via well-known interconnect circuitry (not shown for simplicity) embedded in carrier 110. The embedded interconnect circuitry, which can be formed using any suitable technique, can include one or more layers of conductive wires, traces, or other suitable signal lines.

A plurality of conductive bumps 130 are formed on corresponding conductive pads 121*a* of dice 120(2) and 120(4), and a plurality of conductive bumps 131 are formed on corresponding conductive contacts 115 of carrier 110. Conductive bumps 130 and 131 can be any suitable material, and can be formed using any well-known bumping process. For some embodiments, conductive bumps 130 and 131 are formed using a well-known reflow soldering process, although other techniques can be used to form conductive bumps 130 and 131.

A second coplanar layer of dice 120(1), 120(3), and 120(5) are flip-chip mounted to the first coplanar layer of dice 120(2) and 120(4) and to carrier 110 in a staggered manner via pads 121*a*, contacts 115, and conductive bumps 130/131 such that dice 120(1)–120(5) can be directly connected to each other and to carrier 110 in a cascade configuration without accessing carrier 110's interconnect circuitry. Thus, each die in the first layer is flip-chip connected to two adjacent dice in the second layer, and each die in the second layer is flip-chip connected either (e.g., for dice in the middle) to two adjacent dice in the first layer, or (e.g., for dice at the ends) to one die in the first layer and to carrier 110.

As illustrated by the exemplary embodiment in FIGS. 1A–1C, the top layer of dice 120(1), 120(3), and 120(5) are longer (as measured along the y axis) than the bottom layer dice 120(2) and 120(4), extending beyond cavity 112 and sufficiently overlapping portions of carrier 110 around the periphery of cavity 112 such that conductive pads 121*b* formed on opposite peripheral portions of the top layer dice can align with and make electrical contact with corresponding contacts 115 on carrier 110 via flip-chip bumps 131. In this manner, additional flip-chip connections can be made between the top dice and carrier 110. For some embodiments, carrier 110 provides ground and voltage supply connections to the top dice 120(1), 120(3), and 120(5) via pads 121b and corresponding subsets of contacts 115 and bumps 131.

A suitable underfill material 116 can be used to hold dice 120(1)–120(5) in place and to encapsulate bumps 130 and 131. For some embodiments, underfill material 116 is a suitable epoxy or similar material. The lid 111 is mounted onto carrier 110 in a well-known manner to encapsulate and protect dice 120(1)–120(5) from the external environment, and forms a cavity which houses the top layer of dice 120(1), 120(3), and 120(5). A suitable die attach material 117 can be used to attach lid 111 to the back-side surfaces of dice 120(1), 120(3), and 120(5) and to facilitate heat dissipation from dice 120 to the external environment via lid 111. Die attach material 117 can be any suitable material such as epoxy, soft or hard solder connections, or other suitable adhesive. For some embodiments, die attach materials 113 and 117 are the same material.

The architecture of multi-chip package 100 provides many advantages over prior multi-chip packaged devices. First, because dice 120(1)–120(5) of package 100 are flip-chip connected to each other via conductive bumps 130 and to carrier 110 via conductive bumps 131, propagation delays of signals transmitted between interconnected dice 120 and carrier 110 are minimized, which increases performance. Second, because the dice 120(1)–120(5) are arranged in two overlapping layers on carrier 110, more dice can be mounted in package 100 than in similarly-sized prior packages that include only one layer of dice. Third, because only a portion of dice in the top and bottom die layers overlap one another (e.g., a minimal portion sufficient to allow direct flip-chip connections between the top and bottom layers of dice), the gaps between adjacent dice 120, as well as the gaps between dice 120 and cavity walls 112b, provide efficient heat dissipation from dice 120 to the external environment via carrier 110 and lid 111.

Figure 2:
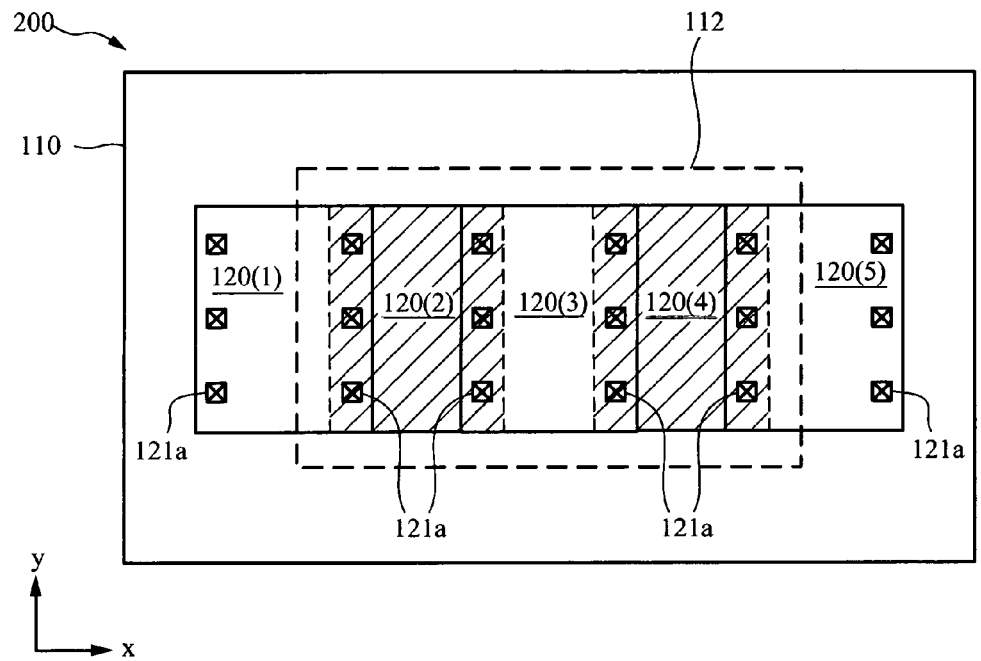
FIG. 2 is a top plan view of a multi-chip package in accordance with another embodiment of the present invention.

For the embodiments described above, top layer dice 120(1), 120(3), and 120(5) are longer than bottom layer dice 120(2) and 120(4) so that each top die extends beyond cavity 112 and includes pads 121b on opposite peripheral portions thereof that can make additional electrical connections with carrier 110. For other embodiments, the top layer dice 120(1), 120(3), and 120(5) can be the same size as the bottom layer dice 120(2) and 120(4), as illustrated by an exemplary package 200 in FIG. 2. Multi-chip package 200, which is another embodiment of package 100 of FIGS. 1A–1C, houses five dice 120(1)–120(5) that are the same size and that can have the same die footprint and/or I/O pad assignments.

Figure 3:
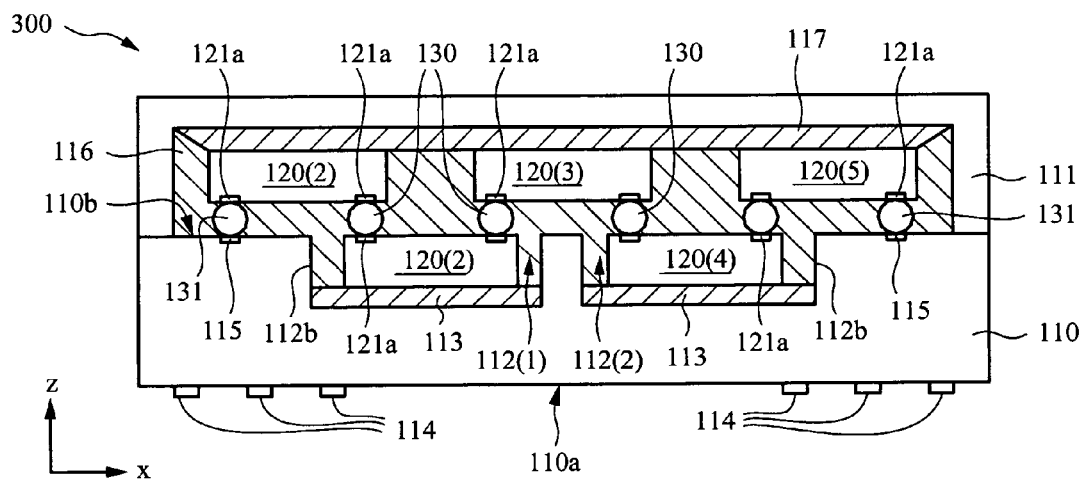
FIG. 3 is a cross-sectional view of a multi-chip package in accordance with yet another embodiment of the present invention.

Further, although described above as having one cavity 112 to house bottom layer dice 120(2) and 120(4), for other embodiments carrier 110 can include a plurality of cavities, each adapted to house a corresponding die. For example, FIG. 3 shows a multi-chip package 300 that is another embodiment of package 100 of FIGS. 1A–1C. The carrier 110 of package 300 includes two separate cavities 112(1) and 112(2), where cavity 112(1) houses IC die 120(2) and cavity 112(2) houses IC die 120(4). By housing dice 120(2) and 120(4) in separate cavities 112(1) and 112(2), respectively, embodiments of package 300 can provide better heat dissipation than embodiments of FIGS. 1A–1C in cases where the thermal dissipation characteristics of carrier 110 are superior to that of underfill material 116 and die attach materials 113 and 117.

As mentioned above, for some embodiments of package 100, dice 120(1)–120(5) can be FPGA devices. An FPGA device is a general purpose device that can be programmed by a user to implement a variety of selected functions. Typically, an FPGA device includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a general interconnect structure that can be programmed to selectively route signals among the various CLBs and IOBs to produce more complex functions of many input signals. The CLBs, IOBs, and the general interconnect structure are programmed by loading configuration data into associated memory cells that control various switches and multiplexers within the CLBs, IOBs, and the interconnect structure to implement logic and routing functions specified by the configuration data.

Figure 4:
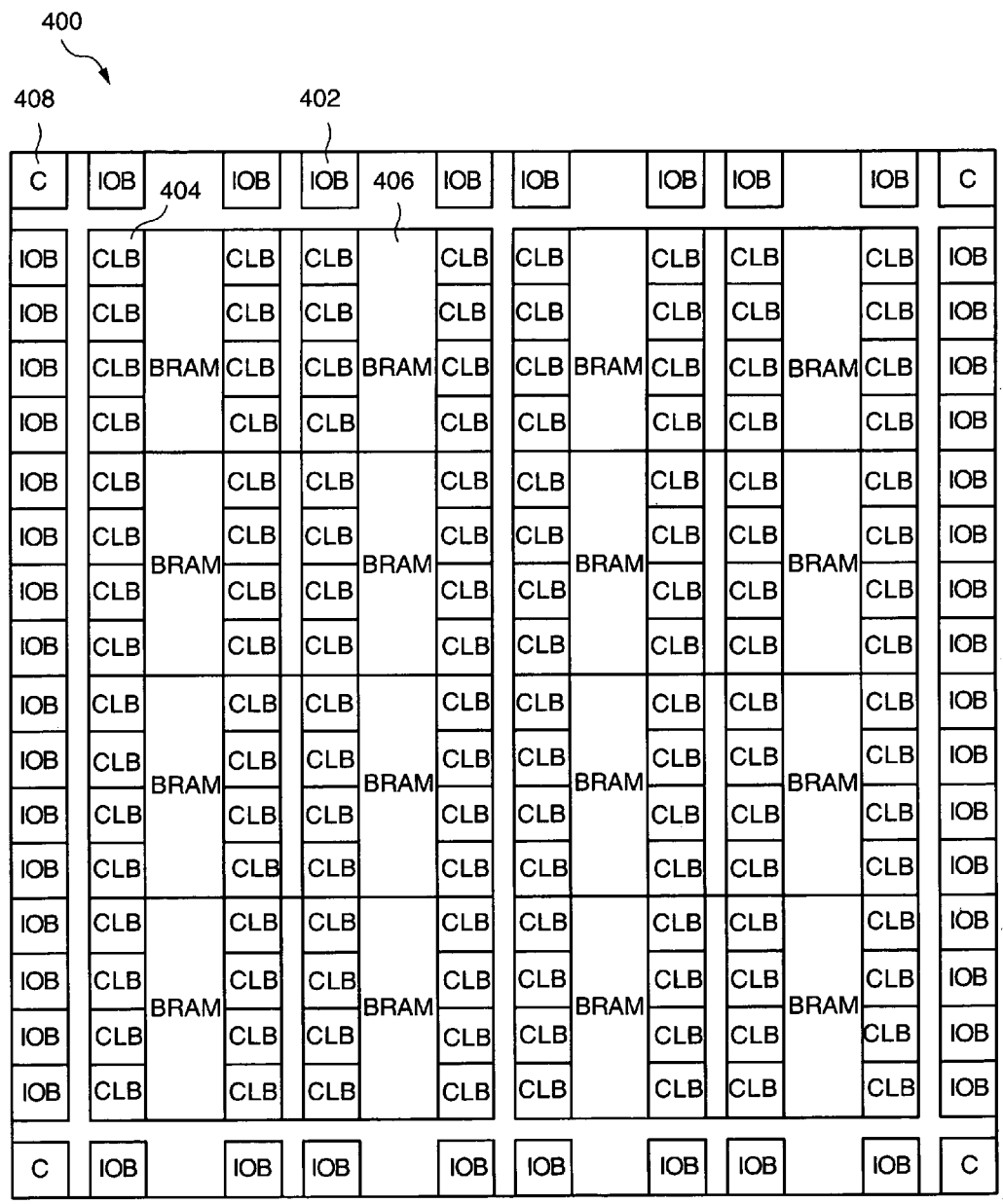
FIG. 4 is a block diagram illustrating the general layout of components of an exemplary FPGA device.

For example, FIG. 4 illustrates the general layout of IOBs, CLBs, and block RAMs (BRAMs) of an FPGA 400. IOBs 402 are well known, and may be located around the perimeter of FPGA 400. CLBs 404 are well known, and may be arranged in columns in FPGA 400. Block RAMs 406 are well known, and may be arranged in columns between adjacent CLB columns. A well-known general interconnect circuitry (not shown for simplicity) is provided to programmably connect the IOBs 402, CLBs 404, and block RAMs 406. Corner blocks 408 are well-known, and can contain configuration circuitry and/or can be used to provide additional routing resources. A more detailed description of the general operation of FPGA 400 is provided in "The Programmable Logic Databook 1998" pages 4–9 to 4–36 available from Xilinx, Inc. of San Jose, Calif., and incorporated by reference herein.

Figure 5:
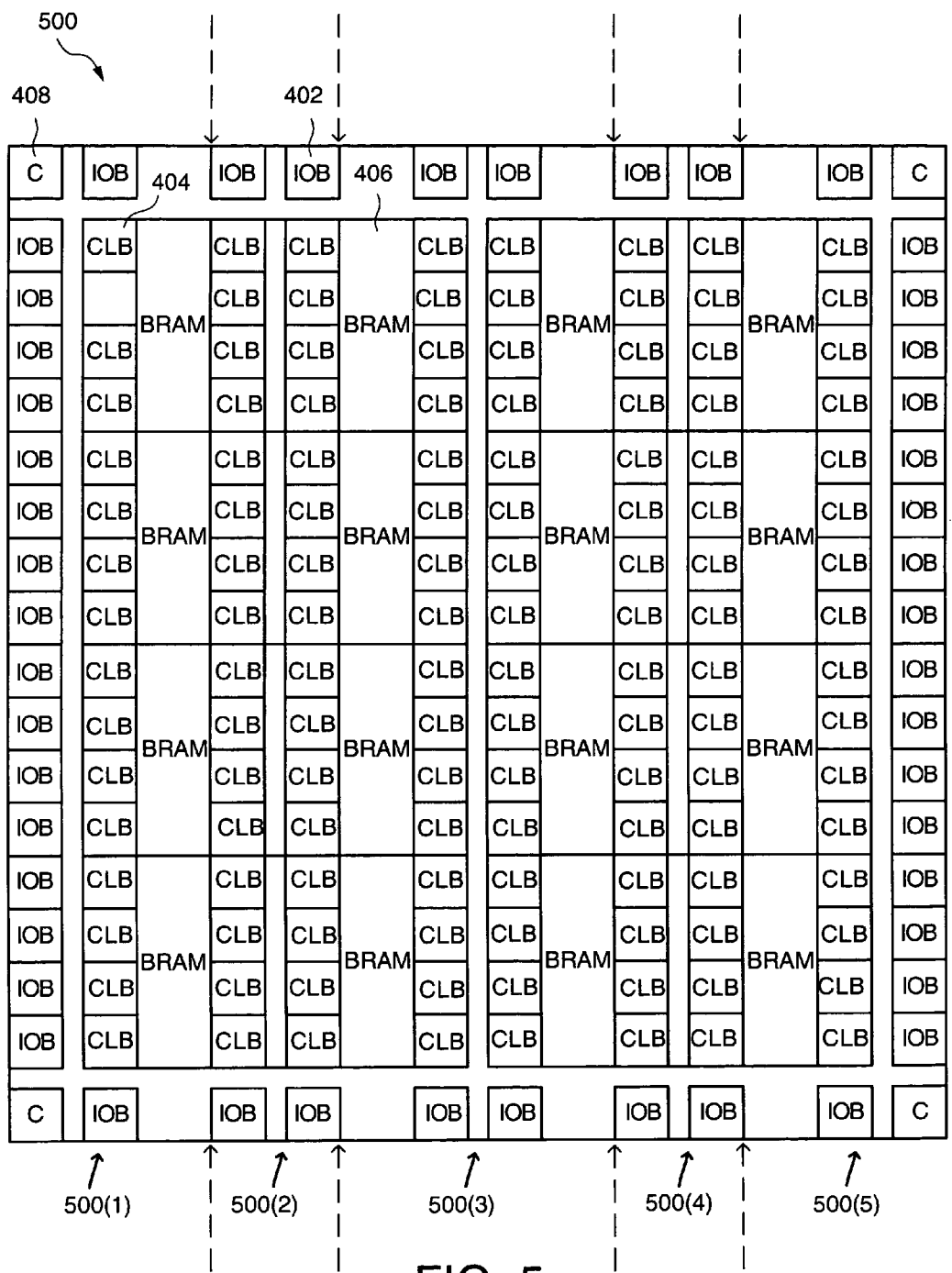
FIG. 5 is a block diagram illustrating an exemplary segmentation of the FPGA device of FIG. 4 into five portions.

For other embodiments, dice 120(1)–120(5) can be configured to implement corresponding selected portions of a single FPGA device. For example, FPGA device 400 can be segmented into five portions 500(1)–500(5), as illustrated in FIG. 5, with each portion 500(1)–500(5) being implemented in a corresponding one of dice 120(1)–120(5) of FIGS. 1A–1C. Thus, when dice 120(1)–120(5) are configured to implement respective FPGA portions 500(1)–500(5) and are cascade connected in package 100 as described above, dice 120(1)–120(5) can collectively implement a single FPGA device such as FPGA 400. By forming an FPGA device as a plurality of individual IC die, rather than forming the entire FPGA device on a single die, each die can be smaller, which in turn increases yield because there is a greater possibility of defects on a large die than on a small die. Thus, as current FPGA devices begin to reach the maximum die size feasible to manufacture, it can become necessary to segment the FPGA function across several IC dice to achieve satisfactory manufacturing results.

Although a particular FPGA layout is illustrated in FIGS. 4 and 5, it is to be understood that many other FPGA layouts are possible, and are considered to fall within the scope of the present invention. For example, other embodiments can have other numbers of IOBs 402, CLBs 404, and block RAMs 406, and can have other types of blocks, such as multipliers or processors. Further, although illustrated in FIG. 5 as being segmented into five portions, for other embodiments, FPGA 400 can be segmented into any suitable number of portions, with each FPGA portion being implemented on a corresponding die 120 mounted in package 100.

Figure 6A:
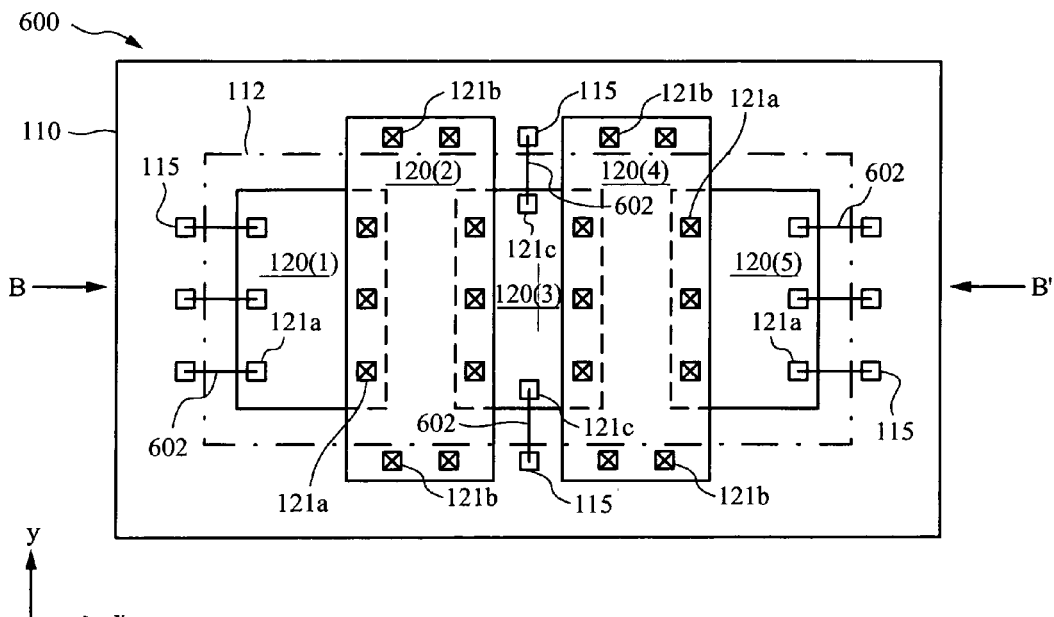
FIG. 6A is a top plan view of a multi-chip package in accordance with still another embodiment of the present invention.
Figure 6B:
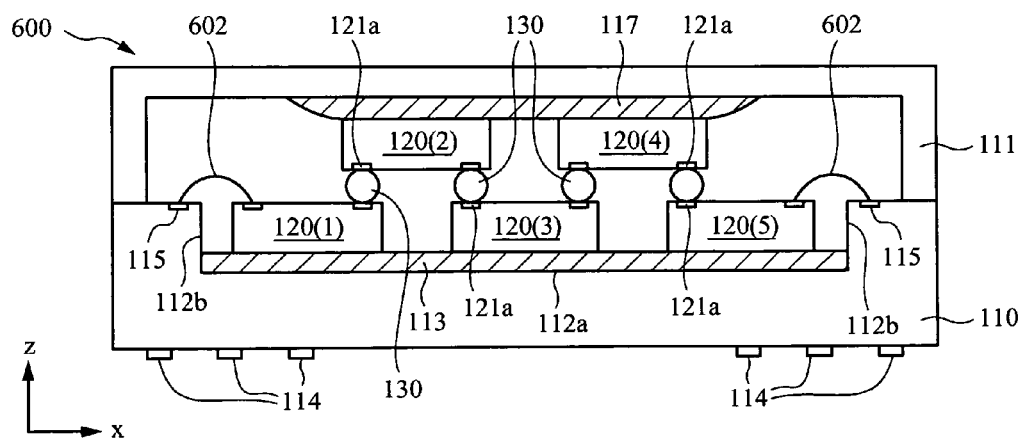
FIG. 6B is a cross-sectional view of the multi-chip package of FIG. 6A along line BB'.

FIGS. 6A–6B show a multi-chip package 600 in accordance with another embodiment of the present invention. Package 600 is similar to package 100 of FIGS. 1A–1C, except that package 600 includes a bottom layer of three dice and a top layer of two dice. As shown in FIGS. 6A and 6B, dice 120(1), 120(3), and 120(5) are back-side mounted to the cavity surface 112a via die attach material 113, and dice 120(2) and 120(4) are flip-chip mounted to two corresponding adjacent dice 120(1), 120(3), and 120(5) via pads 121a and bumps 130 to connect dice 120(1)–120(5) in a cascade configuration via conductive bumps 130. For simplicity, underfill material 116 is not shown in FIG. 6B. However, in contrast to package 100, selected pads 121a of dice 120(1) and 120(5) of package 600 are connected to corresponding contacts 115 on carrier 110 via wire bond connections 602.

As illustrated by the exemplary embodiment in FIGS. 6A–6B, the top layer dice 120(2) and 120(4), which are longer (as measured along the y axis) than the bottom layer dice 120(1), 120(3), and 120(5), extend beyond cavity 112 and sufficiently overlap portions of carrier 110 around the periphery of cavity 112 such that conductive pads 121b formed on opposite peripheral portions of the top layer dice can align with and make electrical contact with corresponding contacts 115 on carrier 110 via flip-chip bumps (similar to multi-chip package 100 shown in FIGS. 1A–C). In this manner, additional connections can be made between the top dice and carrier 110. For some embodiments, carrier 110 provides ground and voltage supply connections to the top dice via the flip-chip bumps. For other embodiments of package 600, the top and bottom layer dice 120 can be the same size. Furthermore, in some embodiments of package 600, selected pads 121c of die 120(3) are connected to corresponding contacts 115 on carrier 110 via wire bond connections 602.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention. For example, other configurations of staggered IC dice are possible, such as ones having dice in one or both layers extend in both the x and y axis directions to form an array of dice, or configurations having more than two layers.

What is claimed is:

1. A semiconductor structure, comprising:
    a carrier having a cavity formed in a top portion thereof, and having a plurality of conductive contacts formed on a top surface of the carrier and positioned around the periphery of the cavity;
    a number of first coplanar integrated circuit dice back-side mounted to a top surface of the cavity; and
    a number of second coplanar integrated circuit dice flip-chip mounted to the first dice in a staggered manner, wherein at least one of the first dice is electrically connected to two adjacent second dice.

2. The structure of claim 1, wherein only minimal portions of the first and second dice overlap.

3. The structure of claim 1, wherein the first and second dice are connected to each other in a cascade configuration without using an interconnect circuitry formed as part of the carrier.

4. The structure of claim 1, wherein the first dice are positioned within the cavity such that active surfaces of the first dice are substantially flush with the top surface of the carrier.

5. The structure of claim 1, wherein a first and a last of the second dice are each flip-chip connected to first subsets of the conductive contacts formed on the carrier.

6. The structure of claim 5, wherein the first and second dice are cascade connected between the first subsets of the conductive contacts formed on the carrier.

7. The structure of claim 6, wherein each of the second dice includes a number of pads formed in opposite peripheral portions thereof that are flip-chip connected to a second subset of the conductive contacts formed on the carrier.

8. The structure of claim 1, wherein each of the second dice is flip-chip connected to corresponding conductive contacts formed on the carrier.

9. The structure of claim 1, wherein at least one of the first dice is wire-bonded to a subset of the conductive contacts formed on the carrier.

10. The structure of claim 1, wherein the first and second dice comprise programmable logic devices.

11. The structure of claim 1, wherein a plurality of dice selected from the first and second dice is configured to implement a selected portion of a programmable logic device.

12. The structure of claim 11, wherein the plurality of dice selected from the first and second dice collectively implement the programmable logic device.

13. A semiconductor structure, comprising:
    a carrier having a cavity formed in a top portion thereof, and having a plurality of conductive contacts formed on a top surface of the carrier around the periphery of the cavity;
    first and second coplanar integrated circuit dice back-side mounted to a top surface of the cavity and having active surfaces substantially flush with the top surface of the carrier; and
    third, fourth, and fifth coplanar integrated circuit dice alternately flip-chip connected to the first die and second die in a cascade configuration.

14. The structure of claim 13, wherein the dice are connected in a cascade configuration between subsets of the conductive contacts formed on the carrier without using an interconnect circuitry formed as part of the carrier.

15. The structure of claim 13, wherein the third die is flip-chip connected to a first subset of the conductive contacts and flip-chip connected to the first die, the fourth die is flip-chip connected to the first die and to the second die, and the fifth die is flip-chip connected to the second die and flip-chip connected to a second subset of the conductive contacts.

16. The structure of claim 13, wherein each of the third, fourth, and fifth dice includes a number of pads formed on opposite peripheral portions thereof that are flip-chip connected to subsets of the conductive contacts formed on the carrier.

17. The structure of claim 16, wherein the subsets of the conductive contacts provide ground and power connections to the third, fourth, and fifth dice.

18. The structure of claim 13, wherein each of the dice comprises a programmable logic device.

19. The structure of claim 13, wherein at least two dice are each configured to implement a selected portion of a programmable logic device.

20. The structure of claim 19, wherein the at least two dice collectively implement the programmable logic device.

21. A semiconductor structure, comprising:
    a carrier having a cavity formed in a top portion thereof, and having a plurality of conductive contacts formed on a top surface of the carrier around the periphery of the cavity;

first, second, and third coplanar integrated circuit dice back-side mounted to a top surface of the cavity and having active surfaces substantially flush with a top surface of the carrier;

a fourth integrated circuit die flip-chip connected to the first and second dice; and a fifth integrated circuit die flip-chip connected to the second and third dice.

22. The structure of claim 21, wherein the fourth and fifth dice are coplanar.

23. The structure of claim 21, wherein the dice are connected in a cascade configuration without using an interconnect circuitry formed as part of the carrier.

24. The structure of claim 21, wherein the first and third dice are wire-bonded to subsets of the conductive contacts formed on the carrier.

25. The structure of claim 21, wherein the second die is wire-bonded to a subset of the conductive contacts formed on the carrier.

26. The structure of claim 21, wherein the fourth and fifth dice include a number of pads formed in opposite peripheral portions thereof that are electrically connected to subsets of the conductive contacts formed on the carrier.

27. The structure of claim 26, wherein the fourth and fifth dice are flip-chip connected to the conductive contacts formed on the carrier.

28. The structure of claim 21, wherein each of the dice comprises a programmable logic device.

29. The structure of claim 21, wherein at least two dice are each configured to implement a selected portion of a programmable logic device.

30. The structure of claim 29, wherein the at least two dice collectively implement the programmable logic device.

* * * * *